(12) United States Patent
Ochiai et al.

(10) Patent No.: US 7,526,006 B2
(45) Date of Patent: Apr. 28, 2009

(54) LASER POWER CONTROL CIRCUIT

(75) Inventors: Minoru Ochiai, Kyoto (JP); Yoshihiro Kanda, Osaka (JP)

(73) Assignee: Panasonic Corporation, Osaka (JP)

( * ) Notice: Subject to any disclaimer, the term of this patent is extended or adjusted under 35 U.S.C. 154(b) by 13 days.

(21) Appl. No.: 11/515,745

(22) Filed: Sep. 6, 2006

(65) Prior Publication Data
US 2007/0002912 A1    Jan. 4, 2007

Related U.S. Application Data

(62) Division of application No. 10/853,131, filed on May 26, 2004, now abandoned.

(30) Foreign Application Priority Data

May 26, 2003    (JP)    ............................. 2003-148328

(51) Int. Cl.
    *H01S 3/00* (2006.01)
(52) U.S. Cl. ..................... 372/33; 372/38.1; 372/38.01; 372/38.02; 372/38.04; 372/38.07; 372/38.09
(58) Field of Classification Search ............... 372/33, 372/38.1, 38.01, 38.02, 38.04, 38.07, 38.09
See application file for complete search history.

(56) References Cited

U.S. PATENT DOCUMENTS

| 4,639,924 | A | * | 1/1987 | Tsunekawa | ................... 372/33 |
| 4,837,428 | A | | 6/1989 | Takagi et al. | |
| 5,140,603 | A | * | 8/1992 | Anderson et al. | ........ 372/29.02 |
| 5,479,424 | A | | 12/1995 | Sakuyama | |
| 5,736,948 | A | | 4/1998 | Mitsuishi et al. | |
| 5,874,909 | A | | 2/1999 | Soenen et al. | |
| 5,969,654 | A | | 10/1999 | Goldin | |
| 6,946,984 | B2 | * | 9/2005 | Rubin et al. | ................. 341/141 |
| 2002/0172242 | A1 | * | 11/2002 | Seo | ......................... 372/29.02 |

FOREIGN PATENT DOCUMENTS

JP    02-159780    6/1990

* cited by examiner

*Primary Examiner*—Kenneth A Parker
*Assistant Examiner*—Hrayr A. Sayadian
(74) *Attorney, Agent, or Firm*—Wenderoth, Lind & Ponack, L.L.P.

(57) ABSTRACT

A laser power control circuit that is constituted by CMOS transistors reduces variations in a laser power that is emitted from a semiconductor laser, which are caused by a mismatch of the transistors. An offset amount of a differential amplifier is digitally calculated using an A/D converter that is located on the same chip, and a voltage value of a variable voltage source is controlled for applying a voltage in a direction opposite to the offset voltage of the differential amplifier to correct the offset voltage of the laser power control circuit, thereby reducing the variations in the laser power emitted from the semiconductor laser.

5 Claims, 8 Drawing Sheets

LASER POWER CONTROL CIRCUIT

This application is a divisional of U.S. application Ser. No. 10/853,131 filed May 26, 2004 now abandoned.

FIELD OF THE INVENTION

The present invention relates to circuits for controlling the power of a semiconductor laser which is used in optical disc drives or the like and, more particularly, to a method for correcting an offset voltage of a differential amplifier, which is a problem in a case where the control circuit is constituted by a MOS transistor.

BACKGROUND OF THE INVENTION

In an optical disc drive, laser light is applied to an optical disc and a reflected light is converted into an electric signal to be subjected to signal processing, whereby it is possible to reconstruct a physical digital signal that is formed on the optical disc as an electric signal. In recent years, as the optical discs that utilize this principle, read-only disks and rewriteable disks have been put to practical use. In addition, there are various formats depending on recording densities. Accordingly, in optical disc drives, it is necessary that the type of optical disc medium be judged before the signal reconstruction process. Generally, since the reflected light amount when a prescribed amount of light power is applied to the disk is different depending on the type of the optical disc medium, the level of the reflected light amount is detected in the early stage of the medium judgment to estimate the type of the medium, and then after the servo control is performed, recorded data are read to determine the medium. It is possible to change the estimated medium and read the data again to determine the medium even when the estimation based on the reflected light amount is wrong, but because there are a variety of formats, a longer time will be required to start the data reproduction when the medium is erroneously determined in the early medium estimation.

A laser power control circuit that is provided in these optical disc drives performs a control for reducing variations of the laser power which is applied from a laser and keeping the laser power at a constant level even when the operation environments would change.

Further, the operating life of the semiconductor laser would be shortened when a laser power that is higher than a predetermined level is to be obtained. Accordingly, the control of the laser power is important also from the viewpoint of the long-term operation of optical disc equipment.

Figure 8:
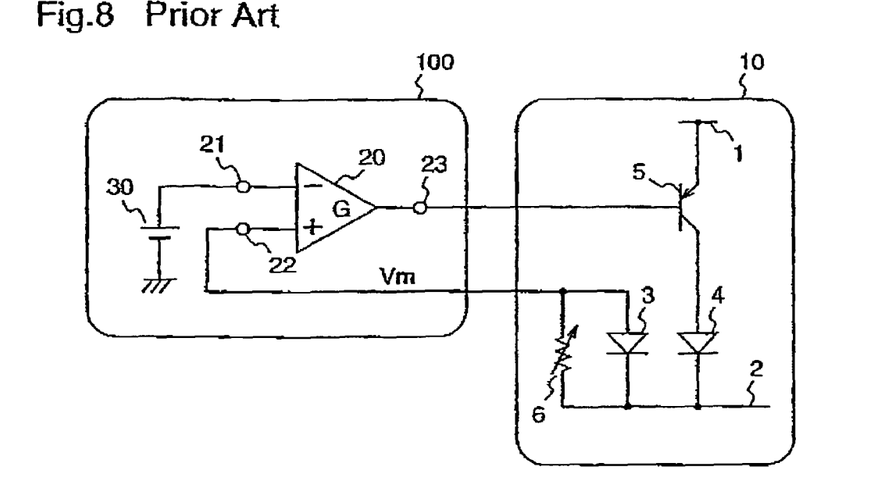
FIG. 8 is a circuit diagram illustrating a structure of a conventional laser power control circuit.

FIG. 8 is a diagram illustrating a specific circuit that embodies this function. Hereinafter, problems of this conventional circuit will be described.

In FIG. 8, reference numeral 1 denotes a positive power supply terminal, numeral 2 denotes a negative power supply terminal, numeral 3 denotes a photodetector element, numeral 4 denotes a semiconductor laser, numeral 5 denotes a semiconductor laser driving transistor, and numeral 6 denotes a photoelectric converting variable resistor. The components 1~6 are referred to as an optical pickup unit (OPU), which is denoted by numeral 10. Reference numeral 20 denotes a differential amplifier, numerals 21 and 22 denote input terminals of the differential amplifier 20, respectively, numeral 23 denotes an output terminal of a laser power control circuit, and numeral 30 denotes a reference voltage source that supplies a voltage value Vr. Numeral 100 denotes a laser power control circuit including these components 20~30, which is usually formed as a semiconductor integrated circuit.

Next, the operation of the conventional laser power control circuit that is constructed as described above will be described. When a current from the positive power supply terminal 1 is supplied to the semiconductor laser 4 through the semiconductor laser driving transistor 5, light emission occurs. A part of the emitted semiconductor laser light is applied to the photodetector element 3, photoelectric conversion is performed with a photovoltaic current, and then the current passes through the photoelectric converting variable resistor 6, resulting in a voltage signal. Hereinafter, this voltage is referred to as a monitor voltage Vm.

The reference voltage source 30 is connected to the negative terminal 21 of the differential amplifier 20, and the above-mentioned voltage signal that has subjected to the photoelectric conversion is inputted to the positive terminal 22. Further, the output terminal 23 of the differential amplifier 20 is connected to the base terminal of the semiconductor laser driving transistor 5. Here, when the terminal voltage of the non-inverting terminal 22 is higher than the terminal voltage of the inverting terminal 21, the voltage of the output terminal 23 increases because the terminal 22 is a non-inverting terminal of the differential amplifier 20, whereby a base-to-emitter voltage of the semiconductor laser driving transistor 5 decreases. Consequently, the current passing through the semiconductor laser driving transistor 5 decreases, the current passing through the semiconductor laser 4 decreases, and the irradiated light power also decreases. Further, since the photovoltaic current of the photodetector element 3 decreases, the terminal voltage of the non-inverting terminal 22 decreases. Conversely, when the terminal voltage of the non-inverting terminal 22 is lower than the terminal voltage of the inverting terminal 21, the laser power control circuit 100 operates in a direction of increasing the terminal voltage of the non-inverting terminal 22 while the current is passing through a loop.

As described above, the connection between the laser power control circuit 100 and the OPU 10 forms a negative feedback loop, and finally the inverting terminal 21 and the non-inverting terminal 22 would have approximately the same voltage.

On the other hand, the luminous efficiency of the semiconductor laser 4 varies greatly, and this means that the levels of the obtained laser power are different even when the same current is supplied. The photoelectric converting variable resistor 6 is for adjusting these variations of the luminous efficiency. The variable resistor 6 makes an adjustment while measuring the laser power from the semiconductor laser 4 so that the voltage of the photoelectric converting variable resistor 6 has a fixed value when a prescribed laser power is obtained. The voltage which is to be adjusted here is the voltage value Vr of the reference voltage source 30 in the laser power control circuit 100.

The OPU 10 that has been adjusted as described above is connected to the laser power control circuit 100 to form a negative feedback loop, whereby the terminal voltage of the photoelectric converting variable resistor 6 is made equal to the voltage value Vr at the power adjustment, and thus the light power that is applied from the semiconductor laser 4 can be controlled to be a constant value.

In recent years, since the breakdown voltage of the transistor becomes lower as the processes of the semiconductor integrated circuit become finer, about 3V of the supply voltage is employed. On the other hand, in order to obtain a high laser power using the semiconductor laser 4, the power supply voltage of the OPU 10 is usually set at about 5V because the forward voltage becomes higher and accordingly it becomes difficult to operate the circuit using 3V of the voltage of the positive power supply terminal 1. The base voltage of the semiconductor laser driving transistor 5 is a voltage which is lowered than 5V by the base-to-emitter voltage (≈0.7V) of the semiconductor laser driving transistor 5. When the connection as shown in FIG. 8 is made under such situation, the terminal voltage of the output terminal 23 of the laser power control circuit 100 will exceed the process breakdown voltage.

Figure 9:
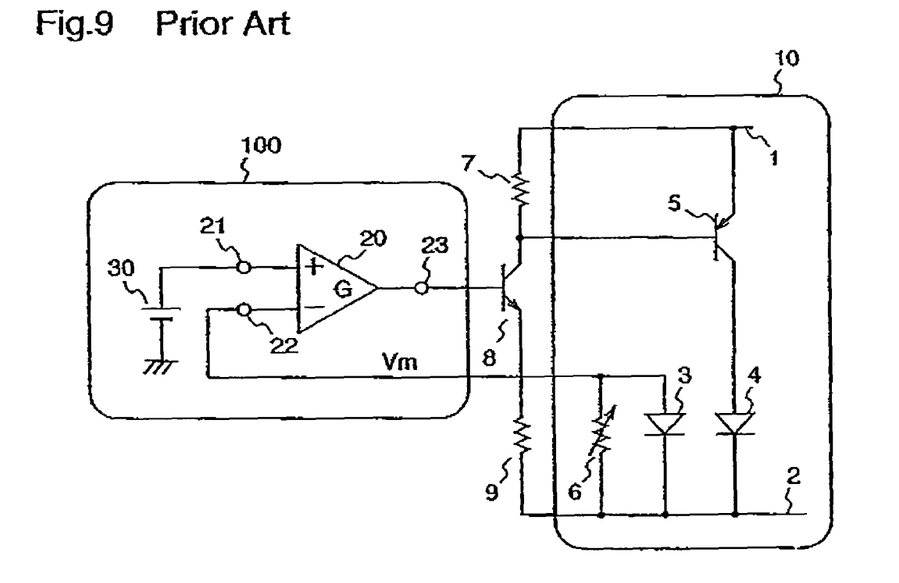
FIG. 9 is a circuit diagram illustrating an example of connection between a laser power control circuit and an OPU in the case where a feedback signal from the laser power control circuit to the OPU has the same polarity.

FIG. 9 is a diagram illustrating an example of a circuit for connecting the laser power control circuit 100 and the OPU 10 when the voltage value of the positive power supply terminal 1 of the OPU 10 and the power supply voltage of the differential amplifier 20 are different from each other. In FIG. 9, reference numeral 8 denotes a transistor that is not included in the semiconductor integrate circuit. The breakdown voltage of the transistor 8 is sufficiently higher than the voltage of the positive power supply terminal 1. Reference numerals 7 and 9 denote resistors, which function as inverting amplifiers. The ratio between end voltages of the resistors 7 and 9 is equal to the ratio between these resistances. In this case, the base voltage of the transistor 8 is obtained by adding a voltage that is dropped at the resistor 9 and the base-to-emitter voltage of the transistor 8 (≈0.7V). Therefore, when the resistance ratio between the resistors 7 and 9 is appropriately selected, the negative feedback loop can be formed without the terminal voltage of the output terminal 23 of the laser power control circuit 100 exceeding the process breakdown voltage. Refer to Japanese Published Patent Application No. Hei. 2-159780 (FIG. 5).

When an ideal differential amplifier is used in the above-mentioned Prior Art, the terminal voltage of the inverting terminal 21 and the terminal voltage of the non-inverting terminal 22 become equal to each other, whereby the laser power applied from the semiconductor laser 4 becomes constant. However, in reality, a voltage that is referred to as an offset voltage occurs in the differential amplifier 20.

Figure 10:
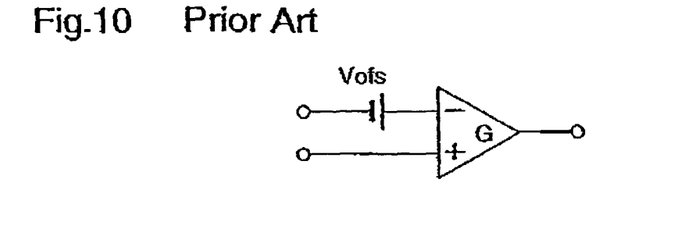
FIG. 10 is a circuit diagram illustrating an equivalent circuit when an offset voltage occurs in a differential amplifier that is a constituent of a laser power control circuit.

FIG. 10 is a diagram equivalently showing a state where an offset voltage occurs in the differential amplifier. When the offset voltage Vofs occurs, a potential is generated between two terminals of the differential amplifier. Consequently, a potential is generated between the voltage value Vr of the reference voltage source 30 and the monitor voltage Vm, whereby the laser power of the semiconductor laser 4 is not kept constant. The offset voltage is caused by a mismatch between transistors requiring relative accuracy, such as differential transistors that are used at the input of the differential amplifier 20. This mismatch occurs remarkably in MOS transistors, the magnitude of which is inversely proportional to the square root of the gate width×the gate length of the MOS transistor. Therefore, as common measures, the sizes of these transistors are increased or the reference voltage value Vr is finely adjusted to correct the offset voltage.

Because the laser power control circuit is formed as a semiconductor integrated circuit, when the transistor size is increased, the chip size is accordingly increased. Further, as the fine adjustment of the reference voltage is performed using a fuse, the production cost is increased.

In addition, as the photodetector element 3 has a diode structure and the current starts passing in the forward direction when an adjust voltage of the photoelectric converting variable resistor 6 is increased, the adjust voltage is usually adjusted at a relatively lower voltage (approximately 100 mV to 200 mV). On the other hand, since the output of the laser power control circuit 100 is decided by the power supply voltage of the OPU 10, a difference occurs between these voltages as a circuit offset voltage. Assuming that the differential voltage between the reference voltage Vr and the output voltage of the laser power control circuit is Voofsn and the gain of the differential amplifier 20 is G, the offset voltage that occurs in the circuit can be expressed by Voofsn/G. The circuit offset voltage can be reduced by increasing the gain G of the differential amplifier 20, while when the gain is extremely increased, the intersection of the gain of the feedback loop becomes higher, resulting in an enlarged noise bandwidth or a lowered stability of the feedback loop. Accordingly, as a common design value, the gain G of the differential amplifier 20 is suppressed at approximately 1000 times. Since approximately 2V of the differential voltage Voofsn occurs, the converted offset voltage to the input part becomes 2 mV in this design. As this value corresponds to 2% of the original reference voltage, this is not always a negligible value. Since this offset voltage cannot be avoided by the transistor size adjustment, trimming of the reference voltage by the fuse is required, which also leads to an increase in the production cost.

Further, in such cases that there is a potential between the supply voltage of the OPU 10 and the laser power control circuit 100 as shown in FIG. 9, the connection between the laser power control circuit 100 and the OPU 10 must be changed, and further the specifications of the laser power control circuit 100 must be decided depending on the specifications of the OPU 10.

SUMMARY OF THE INVENTION

The present invention has for its object to provide a laser power control circuit that can obtain a constant laser power without increasing the production cost, and that can be connected to various OPUs.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a 1st aspect of the present invention, there is provided a laser power control circuit in which an electric signal that is obtained by performing a photoelectric conversion to a part of light which is applied from a semiconductor laser is connected to one of input terminals of a differential amplifier, a reference voltage is connected to the other input terminal, and an output of the laser power control circuit is connected to a driving circuit of the semiconductor laser, the laser power control circuit obtains a constant laser power by constituting a negative feedback circuit so that a photoelectric-converted voltage and the reference voltage become equal to each other, the laser power control circuit includes a unit for generating a difference voltage between the input terminals of the differential amplifier; and an A/D converter, converts the reference voltage and the photoelectric-converted voltage into digital signals by the A/D converter, and controls the voltages of the input terminals of the differential amplifier so as to eliminate a voltage difference between the reference voltage and the photoelectric-converted voltage, which have been converted into the digital signals. Therefore, it is possible to suppress occurrence of relative variations such as an offset voltage due to a mismatch between elements that constitute the differential amplifier, thereby obtaining a constant laser power. Further, by using the A/D converter for signal processing in a time divided manner, it is possible to avoid an increase in the circuit scale of the laser power control circuit.

According to a 2nd aspect of the present invention, the laser power control circuit of the 1st aspect includes: reading an offset voltage of the differential amplifier at power-on, and correcting the offset voltage of the differential amplifier by supplying voltages corresponding to the offset voltage to the input terminals of the differential amplifier. Therefore, there is no need to increase the processing speed of the A/D converter, whereby it is possible to obtain a stable light power without changing the specifications of the A/D converter.

According to a 3rd aspect of the present invention, the laser power control circuit of the 1st aspect includes: changing a reference voltage of the A/D converter at reading an offset voltage of the differential amplifier, thereby increasing a resolution. Therefore, it is possible to increase the resolution of the A/D converter, thereby reducing the range of variations in the laser power.

According to a 4th aspect of the present invention, the laser power control circuit of the 2nd aspect includes: changing the reference voltage of the laser power control circuit so as to be within a dynamic range of the A/D converter at reading the offset voltage of the differential amplifier. Therefore, it is possible to measure the offset voltage of the differential amplifier without changing the specifications of the A/D converter.

According to a 5th aspect of the present invention, in the laser power control circuit of the 1st aspect, the differential amplifier comprises amplifiers, and at correcting the offset voltage of the differential amplifier, the voltages of the input terminals of the differential amplifier are controlled so that a potential of the input and a potential of the output of the differential amplifier have the same value when the driving circuit of the semiconductor laser and the control circuit are electrically disconnected and the input of the differential amplifier is short-circuited. Therefore, it is possible to correct the offset voltage of the differential amplifier without imposing a stress on the semiconductor laser.

According to a 6th aspect of the present invention, in the laser power control circuit of the 5th aspect, the amplifiers of the differential amplifier comprise a first amplifier and a second amplifier, and at reading the offset voltage of the differential amplifier, an offset voltage of the first amplifier by itself and an offset voltage at a time of connecting the first amplifier and the second amplifier to each other are read, respectively, thereby deciding a correction amount. Therefore, it is possible to suppress instability due to noises which are produced by the circuit, thereby correcting the offset voltage of the differential amplifier with stability.

According to a 7th aspect of the present invention, in the laser power control circuit of the 6th aspect, the correction amount is certain correction which is performed according to the reference voltage of the laser power control circuit and an output voltage. Therefore, it is possible to correct the offset voltage without increasing the size of the gain changing analog switch.

According to an 8th aspect of the present invention, in the laser power control circuit of the 6th aspect, the differential amplifier comprises a first feedback amplifier and a second feedback amplifier, and the feedback amplifier that forms a feedback loop is changed between at the offset voltage reading and at the normal operation. Therefore, it is also possible to correct the circuit offset voltage that is caused by a difference between the monitor voltage of the OPU and the laser power control circuit output voltage, thereby reducing variations in the light power due to setting of the OPU monitor voltage.

According to a 9th aspect of the present invention, in the laser power control circuit of the 1st aspect, the photoelectric-converted voltage and the reference voltage are interchangeably connected to the respective input terminals of the differential amplifier. Therefore, it is possible to perform a control with the same semiconductor integrated circuit regardless of the polarity of the signal from the driving input of the OPU to the monitor output, whereby general versatility of the semiconductor integrated circuit is increased, which leads to reduction of the cost.

DETAILED DESCRIPTION OF THE PREFERRED EMBODIMENTS

Hereinafter, embodiments of the present invention will be described with reference to the drawings.

Embodiment 1

Figure 1:
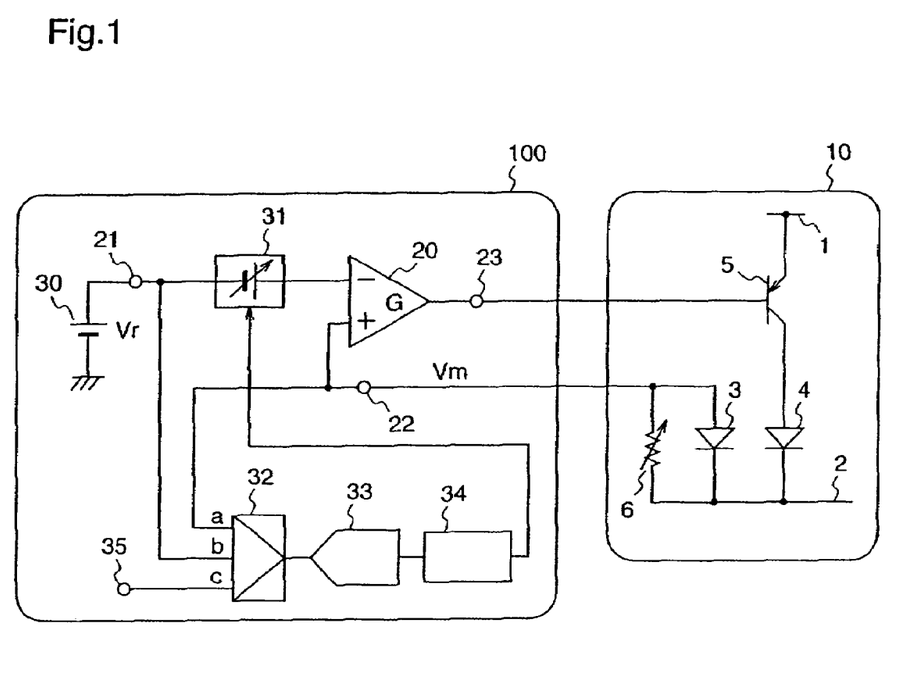
FIG. 1 is a circuit diagram illustrating a structure of a laser power control circuit according to a first or second embodiment of the present invention.

FIG. 1 is a block diagram illustrating a structure of a laser power control circuit according to a first embodiment of the present invention.

In FIG. 1, reference numeral 1 denotes a positive power supply terminal, numeral 2 denotes a negative power supply terminal, numeral 3 denotes a photodetector element that performs photoelectric conversion to a part of a semiconductor laser light that is applied from a semiconductor laser 4, numeral 5 denotes a transistor, and numeral 6 denotes a photoelectric converting variable resistor. The components 1~6 are referred to as an optical pickup unit (OPU), which is denoted by numeral 10. Numeral 20 denotes a differential amplifier, numeral 21 denotes an inverting terminal as an input terminal of the differential amplifier 20, numeral 22 denotes a non-inverting terminal as an input terminal of the differential amplifier 20, and numeral 23 denotes an output terminal of a laser power control circuit. Numeral 30 denotes a reference voltage source for supplying a reference voltage having a voltage value Vr, numeral 31 denotes an offset correction variable voltage source having outputs of positive and negative polarities, numeral 33 denotes an A/D converter, numeral 32 denotes a selector that selects one from among a first input a, a second input b, and a third input c, thereby to supply the selected signal to the A/D converter 33, numeral 34 denotes an operation unit for performing an operation to a digital signal that is outputted from the A/D converter 33, and numeral 35 denotes an input terminal for inputting a signal to the A/D converter 33 at the normal operation. Numeral 100 denotes a laser power control circuit including these components 20~35, which is usually formed as a semiconductor integrated circuit.

Next, the operation of the laser power control unit will be described.

When a current from the positive power supply terminal 1 is supplied to the semiconductor laser 4 through the semiconductor laser driving transistor 5, a light emission phenomenon occurs. A part of the semiconductor laser light that is generated due to the light emission phenomenon is applied to the photodetector element 3, photoelectric conversion is performed with a photovoltaic current, and then the current passes through the photoelectric converting variable resistor 6, resulting in a voltage signal. This voltage is used as a monitor voltage Vm. Here, the resistance value of the photoelectric converting variable resistor 6 is adjusted so that the monitor voltage Vm when a prescribed light emission power is obtained becomes equal to the voltage Vr of the reference voltage source 30 in the laser power control circuit 100.

The reference voltage source 30 is connected to the inverting terminal 21 of the differential amplifier 20 via the offset correction variable voltage source 31. Further, this connection point is also connected to the second input b of the selector 32. Here, the offset correction variable voltage source 31 is a voltage source having positive and negative polarities with respect to 0V. On the other hand, the above-mentioned photoelectric converted monitor voltage Vm is inputted to the non-inverting terminal 22 (hereinafter, the monitor voltage Vm that is inputted to the non-inverting terminal 22 is referred to as a terminal voltage Vm), and further the first input a of the selector 32 is connected to the non-inverting terminal 22. The output terminal 23 of the differential amplifier 20 is connected to the base terminal of the semiconductor laser driving transistor 5.

Here, when the voltage value of the offset correction variable voltage source 31 is 0V and the terminal voltage Vm that is applied to the non-inverting input terminal 22 of the differential amplifier 20 is higher than the voltage value Vr that is applied to the inverting input terminal 21 of the differential amplifier 20, the voltage of the output terminal 23 is increased, and accordingly the base-to-emitter voltage of the semiconductor laser driving transistor 5 is reduced. Consequently, as the current passing through the semiconductor laser driving transistor 5 is reduced, the current that is supplied to the semiconductor laser 4 is reduced, which reduces the laser power of the semiconductor laser 4. As the photovoltaic current of the photodetector element 3 is accordingly reduced, the terminal voltage Vm that is applied to the non-inverting input terminal 22 is reduced. Conversely, when the terminal voltage Vm that is applied to the non-inverting input terminal 22 is lower than the voltage value Vr that is applied to the inverting input terminal 21, the laser power control circuit operates while passing the current through a loop so that the terminal voltage Vm that is applied to the non-inverting input terminal 22 is increased.

As described above, the laser power control circuit 100 and the OPU 10 are connected so as to form a negative feedback loop, whereby the terminal voltage of the inverting input terminal 21 and the terminal voltage of the non-inverting input terminal 22 finally become almost equal to each other. Thus, when an offset voltage Vofs occurs in the differential amplifier 20 as shown in FIG. 10, the inverting terminal voltage V (−) of the differential amplifier 20 is expressed as follows:

$$V(-) = Vr + Vofs \tag{1}$$

Then, the non-inverting terminal voltage V(+) of the differential amplifier 20 becomes the same as the voltage V(−) because of the negative feedback loop. As the voltage V(+) is equal to the monitor voltage Vm of the OPU 10, there is produced a deviation from an expected value Vr.

Next, a description will be given of the method for correcting the above deviation from the expected value of the monitor voltage Vm.

The A/D converter 33 is commonly used to convert a continuously varying analog signal into a digital signal to subject the signal to signal processing as discrete data. It is known that the analog signal can be reconstituted as a digital signal when the signal is converted into a digital signal at a speed that is twice as fast as the frequency of the processed analog signal or a higher speed. Accordingly, there is usually employed a method of sequentially changing inputs to the A/D converter and converting the same into digital data, without converting plural analog signals using the respective A/D converters.

The selector 32 switches input signals to the A/D converter 33. In FIG. 1, the selector has a structure of selecting one of three signals. The first input a is connected to the terminal voltage Vm of the non-inverting input terminal 22 of the differential amplifier 20, the second input b is connected to the voltage Vr of the reference voltage source 30 of the laser power control circuit 100, and the third input c is connected to the signal from the input terminal 35, respectively. The selector 32 that is constructed as described above initially selects the first input a as the input to the A/D converter 33, and the A/D converter 33 converts the terminal voltage Vm of the non-inverting input terminal 22 to a digital signal. Next, the selector 32 selects the second input b as the input to the A/D converter 33, and the A/D converter 33 converts the voltage Vr of the reference voltage source 30 to a digital signal. Then, on the basis of the voltage Vr and the terminal voltage Vm that have been converted to the digital signals, a difference voltage between the voltage Vr and the terminal voltage Vm is calculated by the operation unit 34. The calculated difference voltage is supplied to the offset correction variable voltage source 31, and a second feedback loop is formed so that the voltage value Vr of the reference voltage source 30 and the monitor voltage Vm become equal to each other, thereby correcting a deviation between the monitor voltage Vm and the voltage Vr of the reference voltage source 30, which is caused by the offset voltage Vofs of the differential amplifier 20, and accordingly obtaining a constant laser power.

As described above, the laser power control circuit according to the first embodiment which forms a negative feedback circuit by connecting an electric signal that is obtained by performing the photoelectric conversion to a part of the semiconductor laser light applied from the semiconductor laser 4 by the photodetector element 3 to the non-inverting terminal 22 of the differential amplifier 20, connecting the reference voltage from the reference voltage source 30 to the inverting terminal 21, and connecting an output of the laser power control circuit to the driving circuit of the semiconductor laser 4, respectively, so that the photoelectric converted monitor voltage Vm and the voltage Vr of the reference voltage source 30 become equal to each other, thereby obtaining a constant laser power, includes the offset correction variable voltage source 31 that produces a difference voltage between the input terminals of the differential amplifier 20; and the A/D converter 33, and the voltage value Vr of the reference voltage and the input voltage Vm from the photodetector element 3 are converted into digital signals by the A/D converter 33, and the output from the offset correction variable voltage source 31, i.e., the difference voltage between the input terminals of the differential amplifier 20 is controlled so as to eliminate the difference between the voltage value Vr and the input voltage Vm. Therefore, it is possible to obtain a constant laser power without increasing the production cost, as well as obtain a laser power control circuit that can be connected to various OPUs.

Embodiment 2

A laser power control circuit according to a second embodiment will be described.

The structure of the laser power control circuit according to the second embodiment is the same as that of the first embodiment.

In the above-mentioned first embodiment, the voltage value Vr of the reference voltage source 30 and the monitor voltage Vm are DC voltages that do not vary with time. Therefore, when completing a loop for correcting the offset voltage of the differential amplifier 20, all that is needed by the laser power control circuit according to the first embodiment is to hold digital data that are supplied to the offset correction variable voltage source 31. On the other hand, the laser power control circuit according to the second embodiment changes the input of the selector 32 in FIG. 1 to one of the first input a, the second input b, and the third input c at the power-on or the like, thereby correcting an offset voltage of the differential amplifier 20.

As described above, according to the laser power control circuit of the second embodiment, the offset voltage of the differential amplifier 20 is read at the power-on, and voltages corresponding to the offset voltage are supplied to the input terminals of the differential amplifier 20, respectively, to correct the offset voltage of the differential amplifier 20. Therefore, it is not necessary to increase the conversion speed of the A/D converter 33 when converting the analog signal varying with time into a digital signal, and further the need to change the specifications of the A/D converter 33 to correct the offset voltage of the differential amplifier 20 is eliminated, whereby a constant laser power can be obtained with a quite simple structure.

Embodiment 3

A laser power control circuit according to a third embodiment of the present invention will be described with reference to the drawings.

Figure 2:
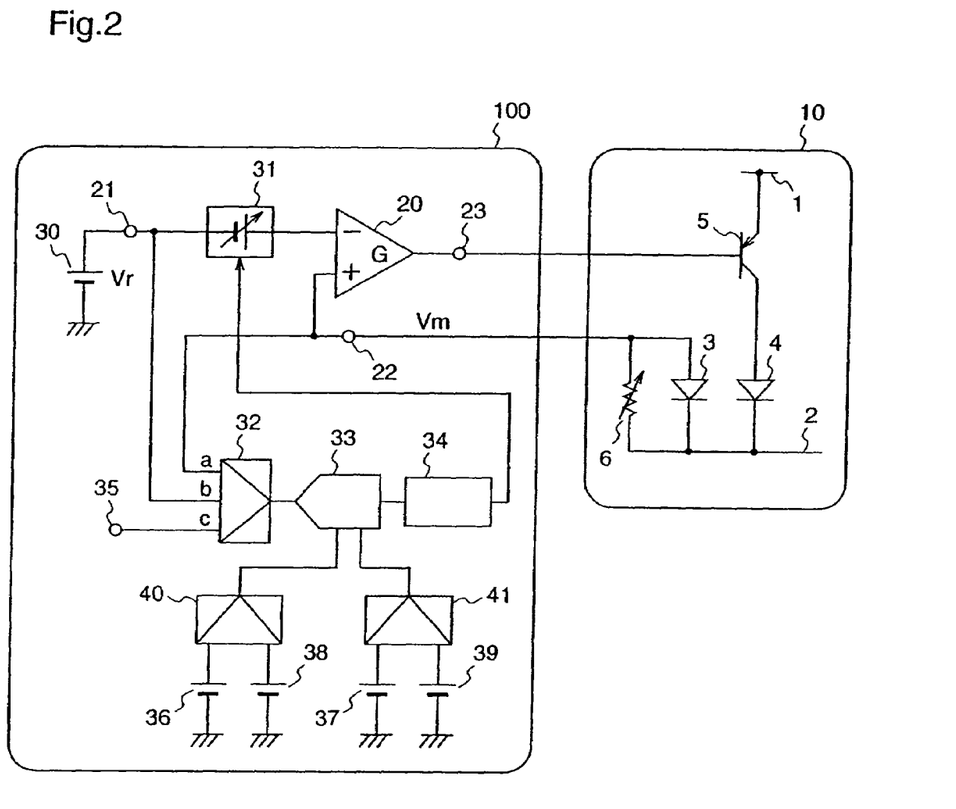
FIG. 2 is a circuit diagram illustrating a structure of a laser power control circuit according to a third embodiment of the present invention.

FIG. 2 is a block diagram illustrating a laser power control circuit according to the third embodiment. In FIG. 2, reference numerals 40 and 41 denote selectors, and numeral 36 to 39 denote voltage sources, respectively. The same components as those in the laser power control circuit according to the first embodiment are denoted by the same reference numerals.

Low reference voltages (Lo voltages) and High reference voltages (Hi voltages) are prepared to the A/D converter 33, and the A/D converter 33 converts an analog signal that is dividedly inputted according to the number of bits between these reference voltages, into discrete data. For example, an 8-bit A/D converter divides a difference between the Lo reference voltage and Hi reference voltage into 256 points, while a 10-bit A/D converter divides the difference into 1024 points. When the number of bits is large, the resolution is increased while the circuit scale is increased. Therefore, the number of bits will never be set higher than necessary and, in many cases, the negative power supply of the circuit (usually 0V) is used as the Lo reference voltage and the positive power supply is used as the Hi reference voltage. When the laser control circuit according to the first embodiment is constructed under this condition, and when it is assumed that the A/D converter comprises 8 bits and the power supply voltage is 3.3V, the resolution becomes approximately 13 mV, and accordingly deviation corresponding to about 13% would adversely occur in the OPU in which the monitor voltage is adjusted to 100 mV.

In the third embodiment as shown in FIG. 2, the voltage sources 36 and 38 are used as the Lo reference voltages of the A/D converter and the voltage sources 37 and 39 are used as the Hi reference voltages of the A/D converter. Further, the selector 40 and 41 change the reference voltage to be used by A/D converter 33 so as to use the voltage sources 36 and 37 at the normal operation, while using the voltage sources 38 and 39 at the correction of the offset.

As described above, according to the laser power control circuit of the third embodiment, the reference voltage of the A/D converter 33 is changed at reading the offset voltage of the differential amplifier 20, whereby the resolution of the A/D converter 33 has a value that is obtained by dividing the voltage difference between the voltage source 38 and the voltage source 39 according to the number of bits of the A/D converter 33. Therefore, even an A/D converter comprising a smaller number of bits can correct the offset voltage with great precision. In FIG. 2, the reference voltage is changed both on the Low side and the High side, while the same effect is achieved even when the reference voltage is changed only on one of the sides.

Embodiment 4

A laser power control circuit according to a fourth embodiment of the present invention will be described with reference to the drawings.

Figure 3:
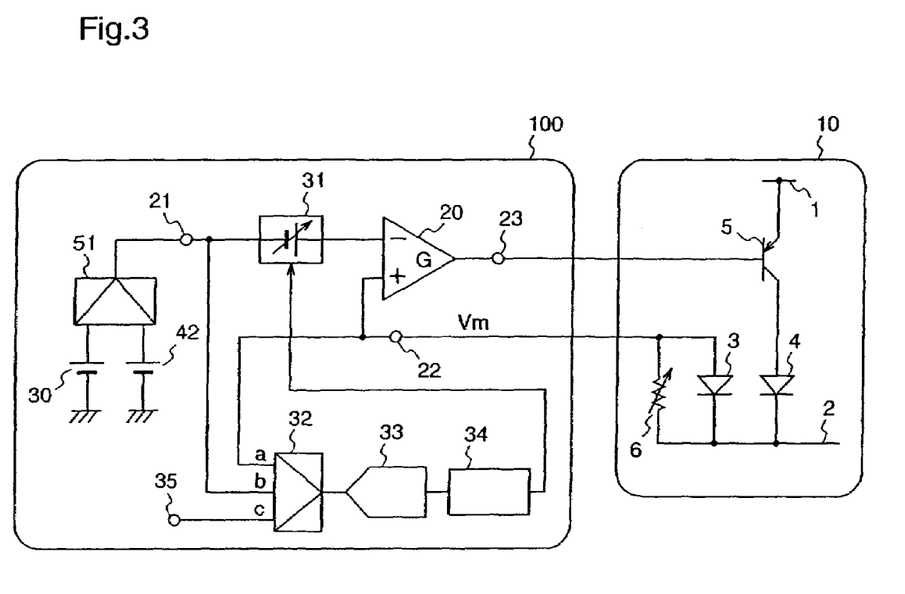
FIG. 3 is a circuit diagram illustrating a structure of a laser power control circuit according to a fourth embodiment of the present invention.

FIG. 3 is a block diagram illustrating a structure of the laser power control circuit according to the fourth embodiment. In FIG. 3, reference numeral 42 denotes a voltage source, and numeral 51 denotes a selector that switches between a voltage from the reference voltage source 30 and a voltage from the voltage source 42 to supply the voltage to the inverting input terminal 21 as an input terminal of the laser power control circuit. Here, the same components as those of the laser power control circuit according to the first embodiment are denoted by the same reference numerals.

The analog signal that is converted into a digital signal does not always vary over all the range extending from the negative power supply to the positive power supply. It is desirable that the resolution at the conversion of the analog signal into the digital signal should be lower and, when the number of bits is increased, the resolution may be reduced but the circuit scale is increased. Thus, when the reference voltage values of the A/D converter 33 are set at upper and lower limit values of the range in which the analog signal may vary, it is possible to reduce the resolution without increasing the circuit scale. However, since the reference voltage of the laser power control circuit is set at a voltage value that is closer to the negative power supply to prevent the photodetector element 3 from being forward biased, the voltage may be deviated from a dynamic range of the A/D converter when the reference voltage of the A/D converter is offset from the negative power supply as described above.

The laser power control circuit according to the fourth embodiment as shown in FIG. 3 solves the above-mentioned problem. This laser power control circuit has a structure of changing the reference voltage of the laser power control circuit at correcting an offset voltage of the differential amplifier 20 using the selector 51.

As described above, the laser power control circuit according to the fourth embodiment changes the reference voltage that is supplied to the laser power control circuit via the inverting input terminal 21, at reading the offset voltage of the differential amplifier 20 so as to make the voltage fall within the dynamic range of the A/D converter 33, thereby correcting the offset voltage with high precision without increasing the number of bits of the A/D converter 33.

Embodiment 5

A laser power control circuit according to a fifth embodiment of the present invention will be described with reference to the drawings.

Figure 4:
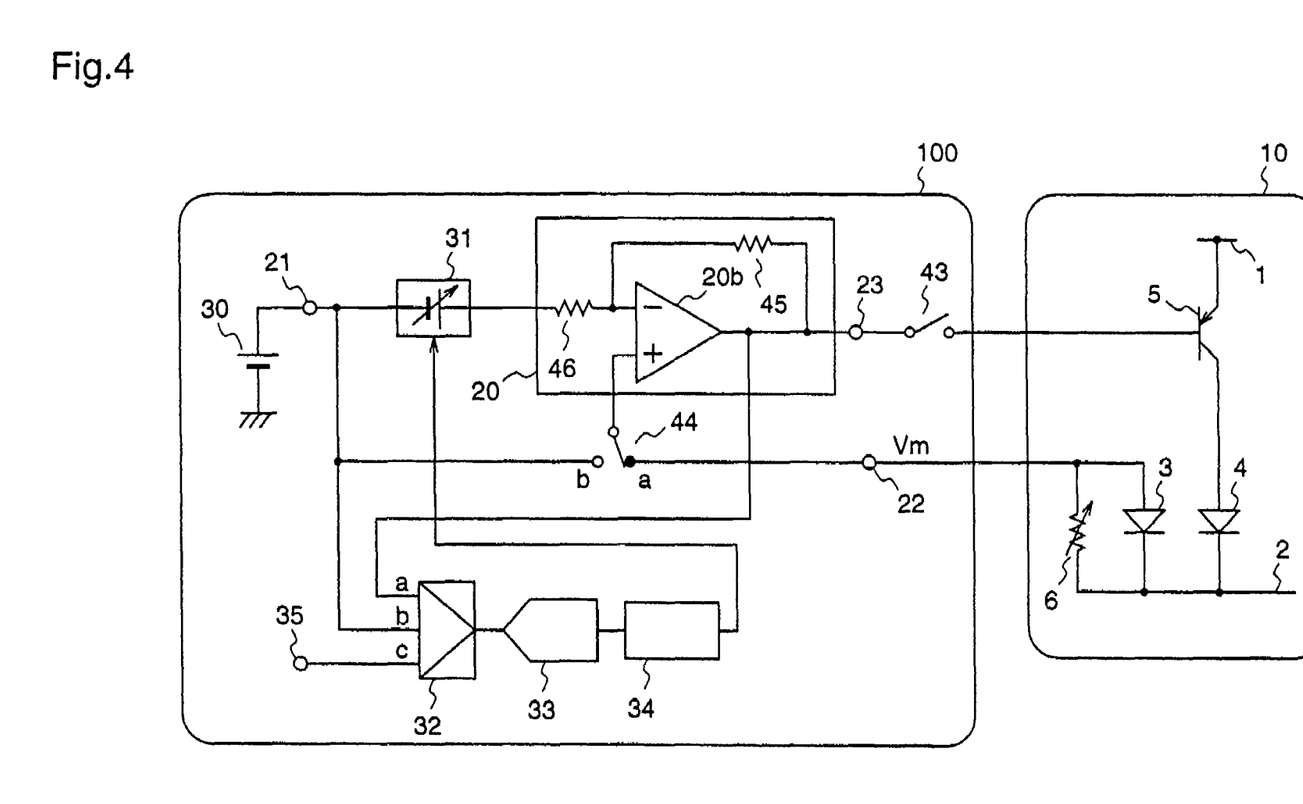
FIG. 4 is a circuit diagram illustrating a structure of a laser power control circuit according to a fifth embodiment of the present invention.

FIG. 4 is a block diagram illustrating a structure of the laser power control circuit according to the fifth embodiment. In FIG. 4, reference numeral 20b denotes an operational amplifier, and numerals 45 and 46 denote resistors, respectively. The operational amplifier 20b and the resistors 45 and 46 constitute a differential amplifier 20 according to the fifth embodiment. Numerals 43 and 44 denote switches, respectively. The same components as those in the laser power control circuit according to the first embodiment are denoted by the same reference numerals.

In the first embodiment, the offset voltage is corrected under a state where the OPU 10 and the laser power control circuit 100 are connected to each other. However, the amplification level of the differential amplifier 20 is commonly set at about 1000 times. Further, data that is outputted from the operation circuit 34 at a stage of performing the offset voltage correction is a digital signal, and when this digital signal is converted to an analog voltage by the offset correction variable voltage source 31, an electric signal in the spike form may be generated, whereby an excessive signal may be transiently supplied to the semiconductor laser 4. This excessive signal can be reduced by lowering the response speed of the offset correction variable voltage source 31, but when the offset correction is carried out only at the power-on as in the second embodiment, the time until completion of the offset correction becomes disadvantageously longer.

The fifth embodiment has for its object to solve this disadvantage, and this embodiment relates to a laser power control circuit that opens the switch 43 and connects the switch 44 to b at correcting the offset voltage of the differential amplifier 20, thereby electrically disconnecting the OPU 10 and the laser power control circuit 100 and correcting the offset voltage of the differential amplifier 20.

At correcting the offset voltage, the voltage value Vr of the reference voltage 30 is inputted to the non-inverting terminal 22 of the operational amplifier 20b because the switch 44 is connected to b side. On the other hand, the operational amplifier 20b is subjected to negative feedback by the resistor 45, thereby constituting an inverting amplifier using the resistor 46 as an input resistor. Therefore, when the voltage value of the offset correction variable voltage source 31 is set at 0V, the voltage value Vr will be applied to the inverting input terminal of the operational amplifier 20b. When no offset voltage occurs in the operational amplifier 20b here, the output voltage from the operational amplifier 20b becomes equal to the voltage value Vr. Accordingly, by obtaining a difference voltage between the voltage value Vr and the output voltage from the operational amplifier 20b with respect to the input to the A/D converter 33 and controlling the voltage value of the offset correction variable voltage source 31 so that the difference voltage becomes 0V, it is possible to correct the offset voltage of the differential amplifier 20.

As described above, according to the laser power control circuit of the fifth embodiment, the differential amplifier 20 is provided with the operational amplifier 20b and the resistors 45 and 46, and the OPU 10 and the laser power control circuit 100 are electrically disconnected at correcting the offset voltage in the differential amplifier 20, and the voltages of the input terminals of the operational amplifier 20b are controlled so that potentials of the input terminal and the output terminal of the operational amplifier 20b when the input of the operational amplifier is short-circuited have the same value. Therefore, it is possible to correct the offset voltage in a short time, without supplying an excessive signal to the semiconductor laser 4.

Embodiment 6

A laser power control circuit according to a sixth embodiment of the present invention will be described with reference to the drawings.

Figure 5:
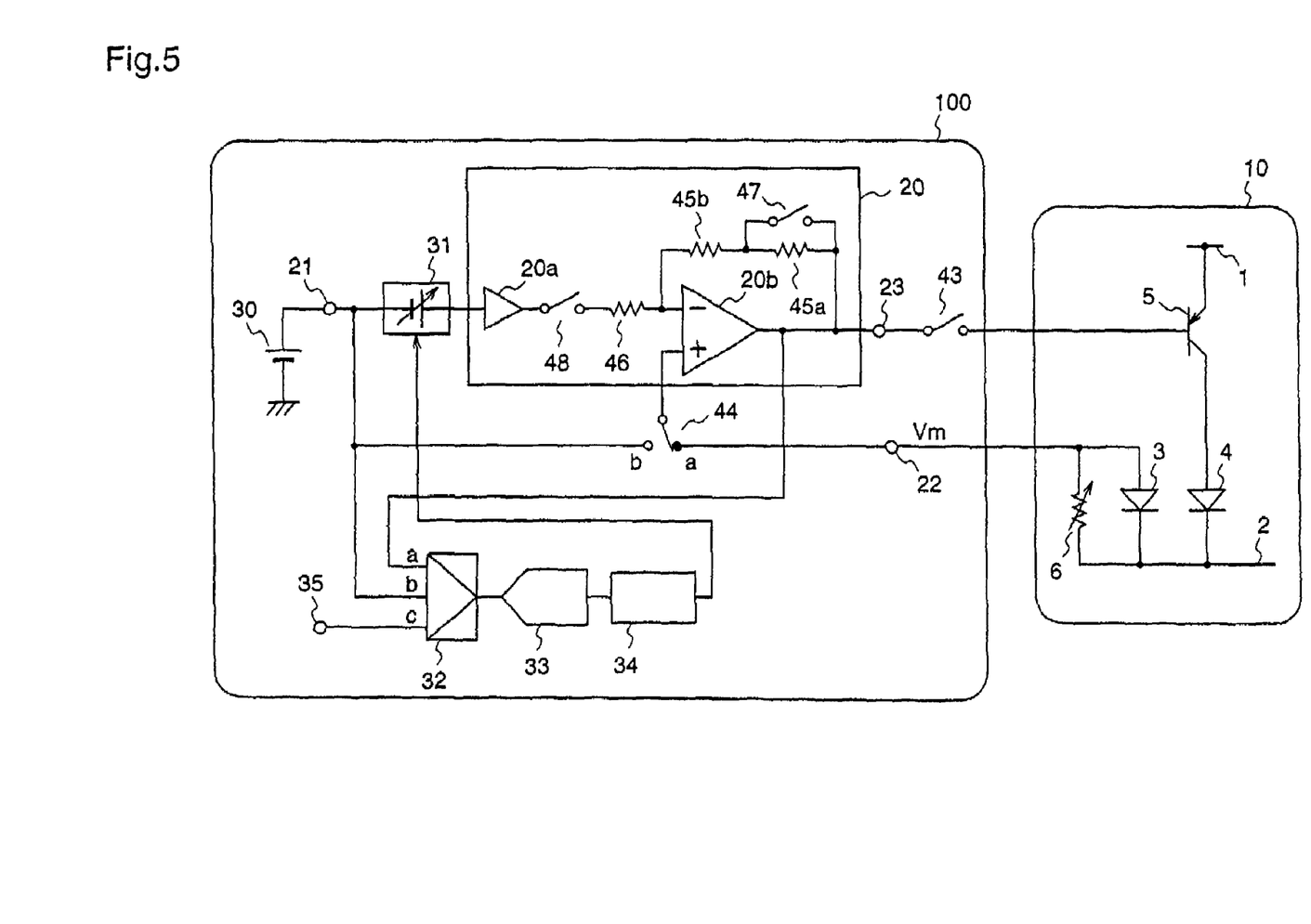
FIG. 5 is a circuit diagram illustrating a structure of a laser power control circuit according to a sixth or eighth embodiment of the present invention.

FIG. 5 is a block diagram illustrating a structure of the laser power control circuit according to the sixth embodiment. In FIG. 5, reference numerals 47 and 48 denote switches, and numerals 45a and 45b denote resistors, respectively. When the switch 47 is opened, a resistance value that is obtained by adding resistances of the resistor 45a and the resistor 45b is equal to the resistance value of the resistor 45 in the fifth embodiment, and further the resistance value of the resistor 45b is set so as to be equal to the resistance value of the resistor 46. Numeral 20a denotes a buffer amplifier the amplification level of which is 1. The same components as those in the first and fifth embodiments are denoted by the same reference numerals.

In this fifth embodiment, the amplification level of the differential amplifier 20 (hereinafter, also referred to as an inverting amplifier) comprising the resistors 45 and 46 and the operational amplifier 20b is about 1000 times. Under this situation, noises occurring from the offset correction variable voltage source 31 or the like are amplified by the inverting amplifier. For example, when noise components of about 0.1 mV are inputted to the inverting amplifier, noises as much as 100 mV will appear on the first input a of the selector 32, whereby measures to digitally obtain an average value of the noises or the like are needed.

The laser power control circuit according to the sixth embodiment is to overcome this problem and, at correcting the offset, corrects the offset voltage of the differential amplifier under a state where the switch 47 is closed, thereby to lower the amplification level of the inverting amplifier, and the instability due to noises is eliminated.

Initially, the switches 43 and 48 are opened, the switch 47 is closed, and the switch 44 is set at b. Under this situation, the reference voltage Vr is inputted to the non-inverting input terminal 22 of the operation amplifier 20b. Further, one end of the resistor 46 is opened, and the output voltage from the operational amplifier 20b is directly fed back to the inverting input via the switch 47 and the resistor 45b, whereby a negative feedback amplifier having the amplification level of 1 is formed. When the offset voltage of the operational amplifier 20b is set at Vofs2, a voltage (Vr−Vofs2) is inputted to the input a of the selector 32.

Then, the switch 48 is closed with keeping the switch 47 closed. Assuming that the offset voltage of the buffer amplifier 20a is Vofs1 and the voltage value of the offset correction variable voltage source 31 is 0V, the output voltage Vo(20b) from the buffer amplifier 20b is expressed as follows:

$$Vo(20b)=Vr+Vofs1-2\times Vofs2 \qquad (2)$$

When no offset voltage occurs in the respective amplifiers, Vo(20b)=Vr. Therefore, when Vo(20b) is set at Vr+Voofs, $$Voofs=Vofs1-2\times Vofs2 \qquad (3)$$

Next, the offset voltage in the normal operation state will be calculated. In the normal operation state, the switch 44 is set at a, the switches 43 and 48 are closed, and the switch 47 is opened. The amplification level of the inverting amplifier 20b is decided according to the ratio between a value that is obtained by adding the resistors 45a and 45b, and the resistor 46. Assuming that this ratio is G and the feedback voltage from the photodetector element 3 is Vm, a voltage Vo(23) of the output 23 from the laser power control circuit 100 is expressed by a following formula:

$$Vo(23)=G\times(Vm-Vr+Vofs1-Vofs2)+(Vm-Vofs2) \qquad (4)$$

In this case, the offset voltage of the circuit of interest is (Vm−Vr). Assuming that the voltage Vo(23) is a variation amount Voofsn from the voltage Vr as described above, Vm−Vr is expressed as follows:

$$Vm-Vr=(Vr-Vm+Vofs2+Voofsn)\times(1/G)+(Vofs2-Vofs1) \qquad (5)$$

When ignoring the first term of Formula (5) because G is approximately 1000 in this case, $$Vm-Vr=Vofs2-Vofs1 \qquad (6)$$

When modifying the formula (3), $$Vofs2-Vofs1=-(Voofs+Vofs2) \qquad (7)$$

Therefore, in order to correct the offset voltage (Vm−Vr) in the normal operation state, it is found that following should be satisfied:

$$Voofs+Vofs2=0 \qquad (8)$$

Here, Voofs in the formula (8) is a difference between a voltage that occurs in the inverting amplifier 20b and the reference voltage Vr at a time when the negative feedback loop of the laser power control circuit is opened to set the amplification level of the inverting amplifier 20b at 1 and to connect the inverting amplifier 20b to the buffer amplifier 20a, and Vofs2 is a difference between a voltage that appears at an output when the switch 48 is opened to set the gain of the operational amplifier 20b at 1, and the reference voltage Vr. Therefore, both of these values can be calculated by the A/D converter 33 and the operation unit 34.

Accordingly, by changing the voltage value of the offset correction variable voltage source 31 so that the formula (8) is satisfied under the state where the negative feedback loop of the laser power control circuit is opened, it is possible to correct the offset voltage in the normal operation state under a situation where the amplification level of the inverting amplifier 20b is lowered to eliminate influences of noises.

As described above, according to the laser power control circuit of the sixth embodiment, the differential amplifier 20 is provided with the buffer amplifier 20a and the operational amplifier 20b, whereby, at reading the offset voltage of the differential amplifier 20, the offset voltage of the operational amplifier 20b and the offset voltage at a time when the buffer amplifier 20a and the operational amplifier 20b are connected are read, respectively, thereby deciding the correction amount. Therefore, it is possible to correct the offset voltage in the normal operation state with stability.

Embodiment 7

A laser power control circuit according to a seventh embodiment of the present invention will be described with reference to the drawings.

Figure 6:
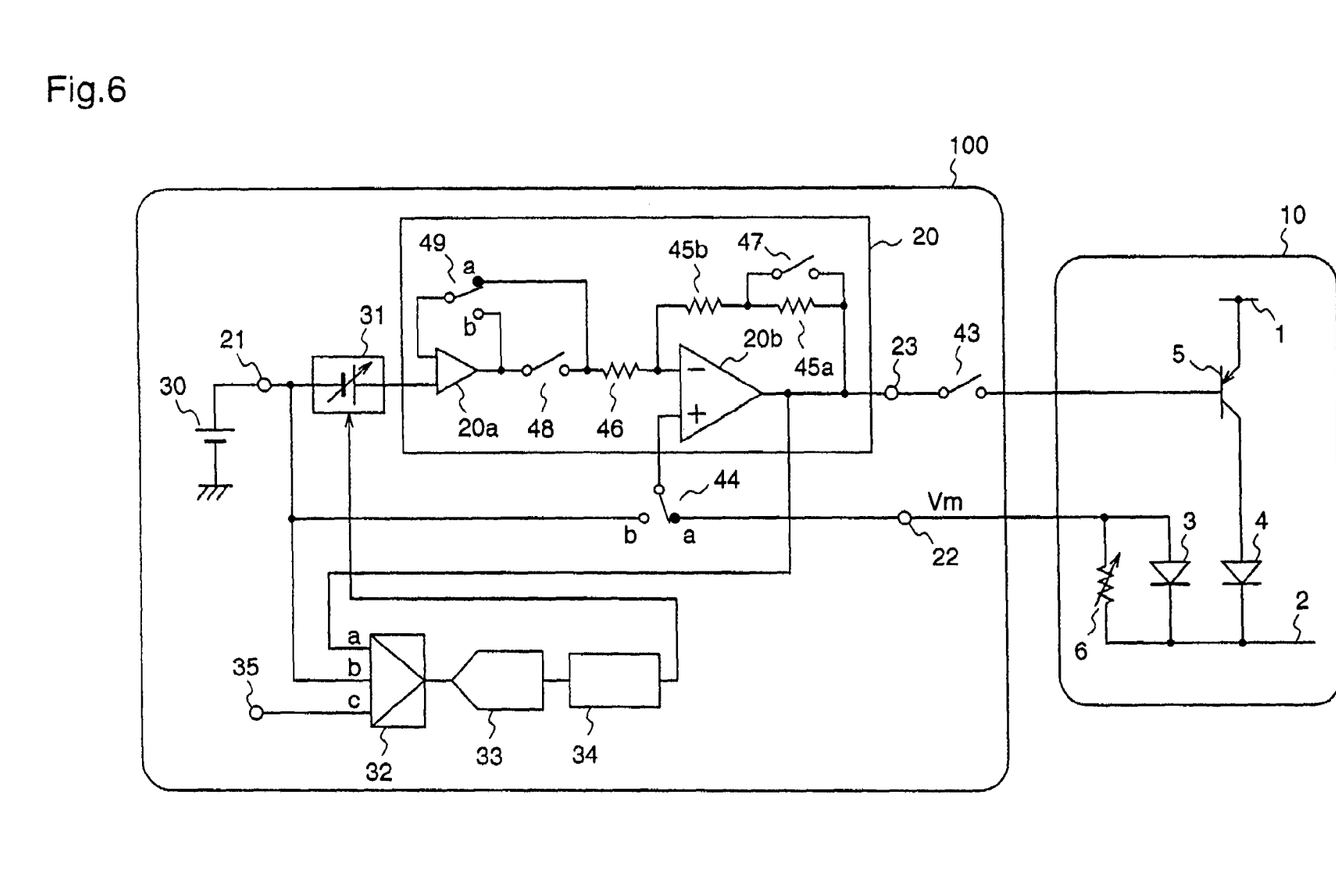
FIG. 6 is a circuit diagram illustrating a structure of a laser power control circuit according to a seventh embodiment of the present invention.

FIG. 6 is a block diagram illustrating a structure of the laser power control circuit according to the seventh embodiment. In FIG. 6, reference numeral 49 denotes a switch. The same components as those in the first, fifth, and sixth embodiments are denoted by the same reference numerals.

In the above-mentioned sixth embodiment, the amplitude level of the inverting amplifier 20b is changed by closing the switch 47. However, in order to achieve approximately 1000 times of the amplification level in the normal operation state, also the ratio between the resistors 46 and 45a becomes about 1000. When the resistors 46 and 45a are formed as an integrated circuit, the resistance value of the resistor 45a is set at some hundreds kΩ because the resistance value of the resistor 45a cannot be set at an extremely high value while the resistance value of the resistor 46 is set at some hundreds Ω. Since the switch 47 is constituted by a transistor in this case, a resistance that is referred to as on-resistance occurs. In the sixth embodiment, the amplification level of the operational amplifier 20b must be set at 1 at the offset correction, while even when the resistance values of the resistors 46 and 45b are set at the same value, the amplification level does not become 1 due to the on-resistance of the switch 47. Further, since the on-resistance of the switch 48 is added to the resistance value of the resistor 46 at the normal operation, the loop gain of the laser power control circuit will be deviated when the on-resistance of the switch 48 is not sufficiently low. In order to make the resistance values of the resistors 47 and 48 negligible, the transistor size must be increased, while this undesirably leads to an increase in the chip size.

The laser power control circuit according to the seventh embodiment is to overcome this problem, and has a structure for changing a gain and performing an offset correction without increasing the size of the transistors that constitute the switches 47 and 48.

The switch 49 is connected to a at the normal operation, while connected to b at the offset correction. Further, when the switches 47 and 48 are constituted by the transistors of the same size, the on-resistances become equal to each other. Here, when the switch 49 is connected to b, the input resistance of the inverting amplifier 20b becomes the sum of the switch 48 and the resistor 46. On the other hand, the feedback resistance is the sum of the switch 47 and the resistor 45b. As the resistance values of the resistors 46 and 45b are set at the same values and the transistor sizes of the switches 47 and 48 are made equal to each other, the amplification level is expressed by a ratio between these sums, and becomes 1. Further, since the switch 49 is connected to a at the normal operation, the connection point between the switch 48 and the resistor 46 becomes equal to the input voltage of the buffer amplifier 20a, whereby it becomes possible to neglect the on-resistance of the switch 48. Therefore, the offset correction of the laser power control circuit can be performed without increasing the transistor sizes of the gain changing switches 47 and 48.

As described above, according to the laser power control circuit of the seventh embodiment, a prescribed correction is added to a correction amount that is decided on the basis of an offset voltage of the operational amplifier 20b and an offset voltage in the case where the buffer amplifier 20a and the operational amplifier 20b are connected to each other, according to the reference voltage and an output voltage of the laser power control circuit, at reading the offset voltage of the differential amplifier 20. Therefore, it is possible to perform offset correction without considering the on-resistances of the switches 47 and 48, thereby eliminating the need to increase the transistor size to reduce the resistances of the switches 47 and 48.

Embodiment 8

A laser power control circuit according to an eighth embodiment of the present invention will be described.

In the above sixth embodiment, since the amplification level G in the first term of the formula (5) expressing the offset voltage is approximately 1000, the first term is neglected from the formula for correcting the offset voltage. Since (Vm−Vr) and Vofs2 are several tens mV at most in the first term of the formula (5), values that are obtained by dividing these values with the amplification level G are sufficiently negligible. On the other hand, Voofsn is a difference voltage between the output voltage of the laser power control circuit 100, which is outputted from the output terminal 23 and the reference voltage Vr, and this difference voltage reaches several V. In the circuit structure as shown in FIG. 6, the base voltage of the semiconductor laser driving transistor 5 is a voltage lower than the voltage value of the positive supply terminal 1 by about 0.7V. When the voltage value of the positive supply terminal 1 is 3.3V, which is a common value that is supplied to the semiconductor integrated circuit, and the reference voltage Vr is 100 mV, Voofsn=3.3−0.7−0.1=2.5 V. When this voltage is divided by the amplification level G=1000, 2.5 mV is obtained, which corresponds to 2.5% of the reference voltage Vr. While it is desirable that the accuracy of the power control should fall within 5%, 2.5% is not exactly a negligible value.

The eighth embodiment is for solving this problem. Since Vr−Vm and Vofs2 are negligible in the formula (5) as described above, $$Vm-Vr=Voofsn/G+(Vofs2-Vofs1) \quad (9)$$

Further, from the formula (7), the voltage value of the offset correction variable voltage source 31 may be changed so that the following formula is satisfied:

$$Voofsn/G-(Voofs+Vofs2)=0 \quad (10)$$

Here, Voofsn is an almost constant value that is uniquely decided by the connecting relation between the OPU 10 and the laser power control circuit 100, and the reference voltage Vr. Accordingly, when the correction amount that is expressed by Voofsn/G is held in the memory and the correction amount is selected under the above conditions, it is possible to perform the offset correction with great accuracy without elongating the sequence of the offset correction.

As described above, according to the laser power control circuit of the eighth embodiment, the correction amount that is represented by Voofsn/G is held in the memory and this correction amount is selected as required to add the same to a variation in the voltage value of the offset correction variable voltage source 31. Therefore, it is possible to perform the offset correction with great precision in a short time.

Embodiment 9

A laser power control circuit according to a ninth embodiment of the present invention will be described with reference to the drawings.

Figure 7:
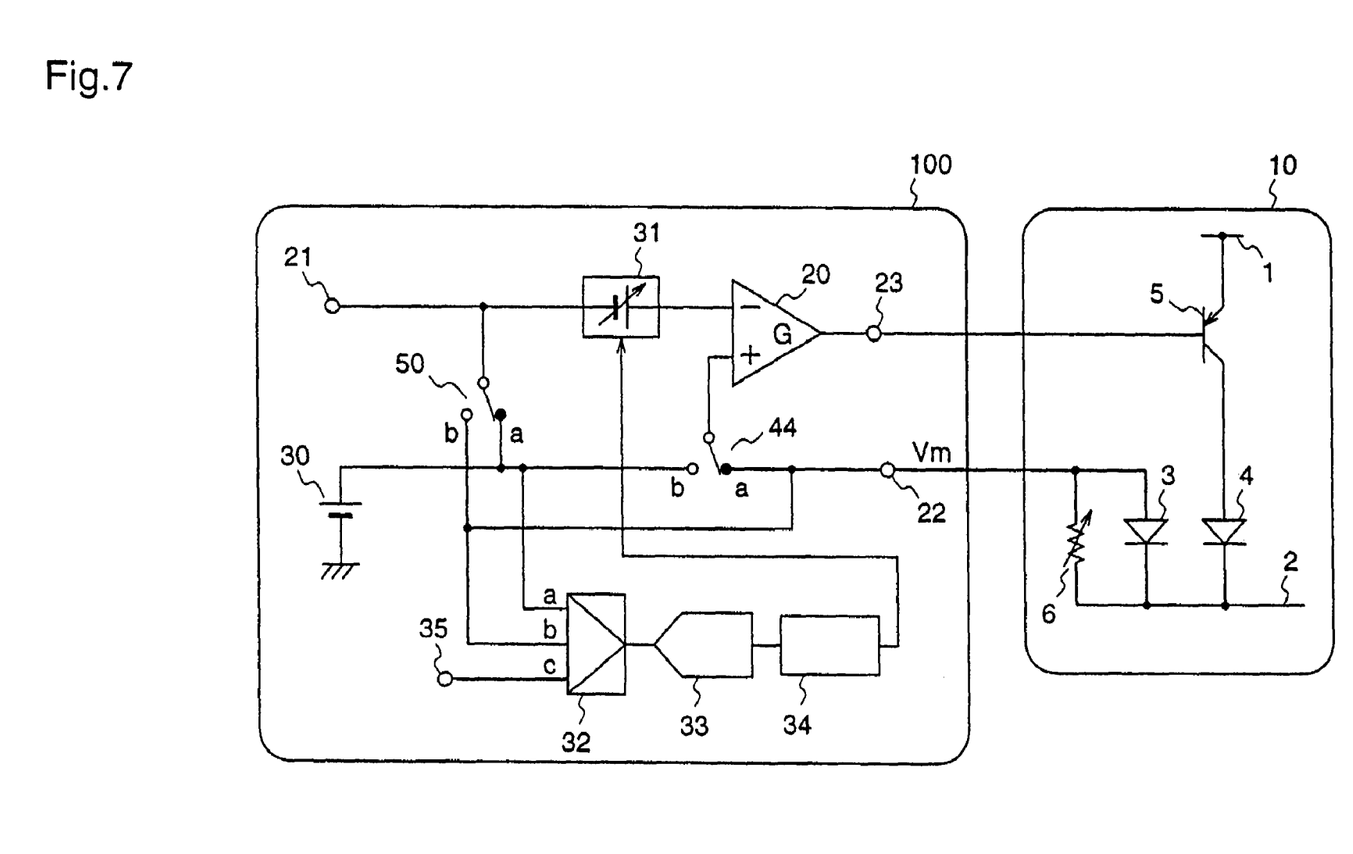
FIG. 7 is a circuit diagram illustrating a structure of a laser power control circuit according to a ninth embodiment of the present invention.

FIG. 7 is a block diagram illustrating a structure of the laser power control circuit according to the ninth embodiment. In FIG. 7, reference numerals 44 and 50 denote switches, respectively. The same components as those in the first embodiment are denoted by the same reference numerals.

As shown in FIG. 7, when the polarity of the voltage that is outputted from the output terminal 23 of the laser power control circuit 100 to be fed back to the input terminal 22 via the OPU 10 is negative, it is necessary that the signal should be returned to the non-inverting input terminal 22 of the differential amplifier 20 to entirely form a negative feedback construction. Accordingly, the switches 44 and 50 are connected to a. Further, when the polarity of the voltage that is fed back from the output 23 of the laser power control circuit to the non-inverting input terminal 22 via the OPU 10 as shown in FIG. 7 is positive, it is necessary that the signal should be returned to the inverting terminal 21 of the differential amplifier 20 to entirely form a negative feedback structure, whereby the switches 44 and 50 are connected to b.

As described above, according to the laser power control circuit according to the ninth embodiment, the feedback signal to the differential amplifier 20 is changed using the switches 44 and 50, whereby it becomes possible to perform the power control using the same laser power control circuit regardless of the polarity of the signal that is fed back from the output 23 of the laser power control circuit via the OPU 10, thereby achieving a driving circuit that can be widely utilized.

What is claimed is:

1. A laser power control circuit for obtaining a constant laser power by performing negative feedback so that a photoelectric-converted voltage which is obtained by photoelectric-converting a portion of light emitted from a semiconductor laser becomes equal to a reference voltage, said laser power control circuit including:
a variable voltage supply connected to the reference voltage;
a first switch that selectively outputs either the reference voltage or the photoelectric-converted voltage;
a differential amplifier having two input terminals, a first one of the input terminals being connected to the variable voltage supply, and a second one of the input terminals being connected to the first switch;
a second switch that selects whether an output of the differential amplifier is transmitted to a laser driving circuit or not;
a selector that receives the reference voltage and an output voltage from the differential amplifier, and selects one of the reference voltage and the output voltage from the differential amplifier; and
an A/D converter that receives from the selector the selected one of the reference voltage and the output voltage from the differential amplifier, and converts the selected one of the reference voltage and the output voltage from the differential amplifier into a digital signal.

2. The laser power control circuit of claim 1, wherein the differential amplifier includes:

a first amplifier that amplifies a signal inputted from the first one of the input terminals of the differential amplifier; and a second amplifier having two inputs, one of the two inputs being an output signal from the first amplifier, and the other one of the two inputs being a signal inputted from the second one of the input terminals of the differential amplifier.

3. The laser power control circuit of claim 2, wherein the differential amplifier further includes:

a third switch that lowers an amplification degree of the second amplifier when the third switch is turned on; and a fourth switch that selects whether the output signal from the first amplifier is to be input to the second amplifier or not.

4. A method for correcting an offset voltage in the laser power control circuit of claim 1, said method comprising:

setting the first switch to a reference voltage side;

turning off the second switch; and adjusting the variable voltage supply so that an A/D converted value of the output voltage from the differential amplifier and an A/D converted value of the reference voltage, which values are convened by the A/D converter, become approximately equal to each other.

5. A method for correcting an offset voltage in the laser power control circuit of claim 3, said method comprising:

setting the first switch to a reference voltage side;

turning off the second switch;

turning on the third switch;

obtaining first data that is an A/D converted value of the reference voltage, which is converted by the A/D converter;

turning on the fourth switch to obtain second data that is an A/D converted value of the output voltage from the differential amplifier, which value is converted by the A/D converter;

turning off the fourth switch to obtain third data that is an A/D converted value of the output voltage from the differential amplifier, which value is converted by the A/D converter; and adjusting the variable voltage supply on a basis of the first to third data.

* * * * *